United States Patent [19]
Sano et al.

[11] Patent Number: 4,724,388
[45] Date of Patent: Feb. 9, 1988

[54] MAGNETIC RESONANCE IMAGING METHOD

[75] Inventors: Koichi Sano, Yokohama; Tetsuo Yokoyama, Tokyo; Hideaki Koizumi, Katsuta, all of Japan

[73] Assignee: Hitachi, Ltd., Tokyo, Japan

[21] Appl. No.: 869,976

[22] Filed: Jun. 2, 1986

[30] Foreign Application Priority Data

Jun. 7, 1985 [JP] Japan .................. 60-122422
Jul. 19, 1985 [JP] Japan .................. 60-158199

[51] Int. Cl.$^4$ ............................. G01R 33/20
[52] U.S. Cl. ............................. 324/309; 324/312; 324/318
[58] Field of Search ............ 324/300, 307, 309, 311, 324/312, 314, 318; 364/414

[56] References Cited

U.S. PATENT DOCUMENTS

| | | | |
|---|---|---|---|
| 3,824,452 | 7/1974 | Freeman et al. | 324/312 |
| 3,968,424 | 7/1976 | Ernst | 324/312 |
| 4,591,789 | 5/1986 | Glover et al. | 324/309 |
| 4,611,172 | 9/1986 | Takase | 324/309 |
| 4,625,171 | 11/1986 | Sekihara et al. | 324/309 |

Primary Examiner—Stewart J. Levy
Assistant Examiner—Kevin D. O'Shea
Attorney, Agent, or Firm—Antonelli, Terry & Wands

[57] ABSTRACT

In order to measure a static field distribution with one scanning operation and to make image distortion corrections with the static field distribution and a gradient field distribution simultaneously considered, an image is reconstructed using a spin echo signal produced under the condition that a time interval between a 90° pulse and a 180° pulse differs from an interval between the 180° pulse and the time origin of the spin echo signal, the static field distribution is evaluated from the relation of distortions to phase errors free from a phase distortion attributed to the characteristic of a detecting part and a phase distortion attributed to the dynamic characteristic of the gradient field, a relations existing between the spatial distortion and phase distortion of the reconstructed image and a magnetic field distribution including the gradient field is obtained, and the distortion magnitude of the reconstructed image is evaluated from the measured magnetic field distribution.

6 Claims, 11 Drawing Figures

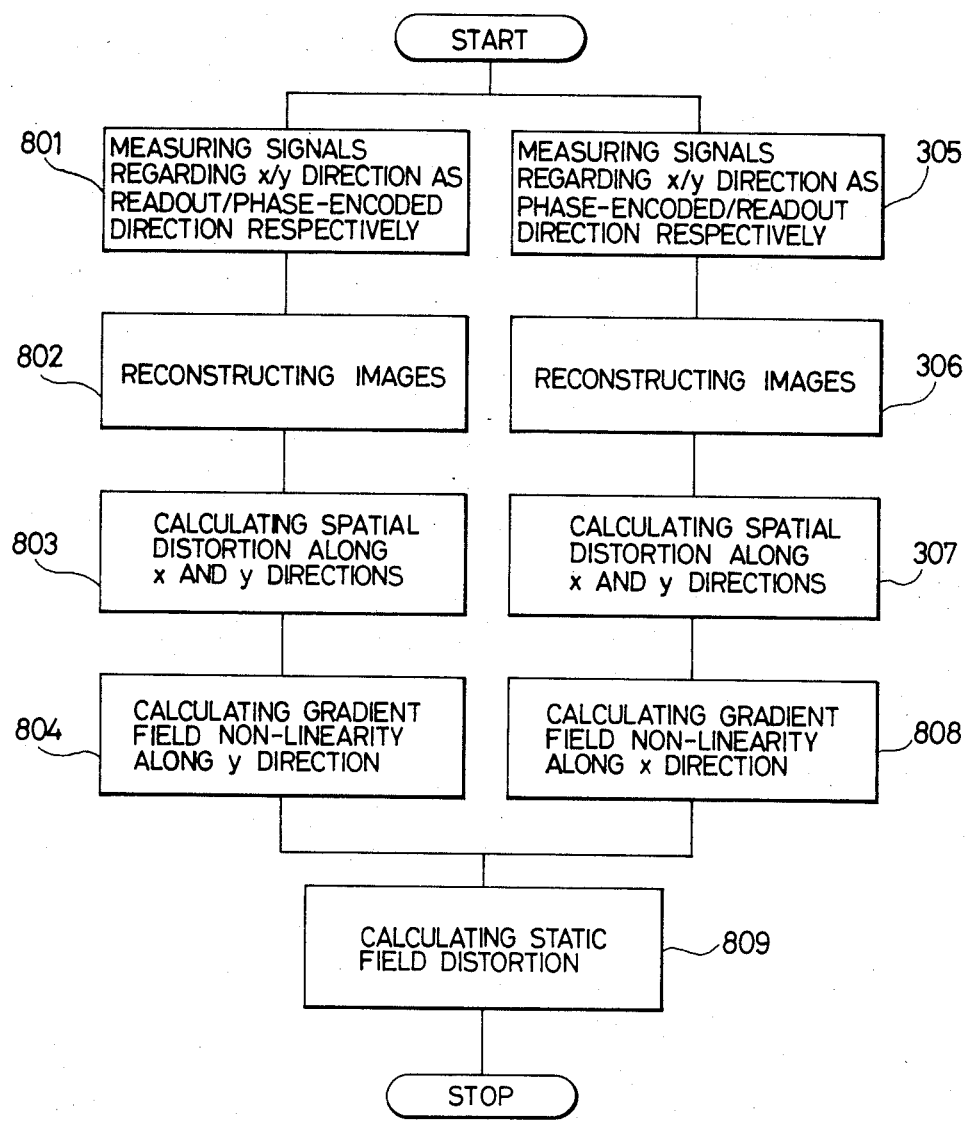

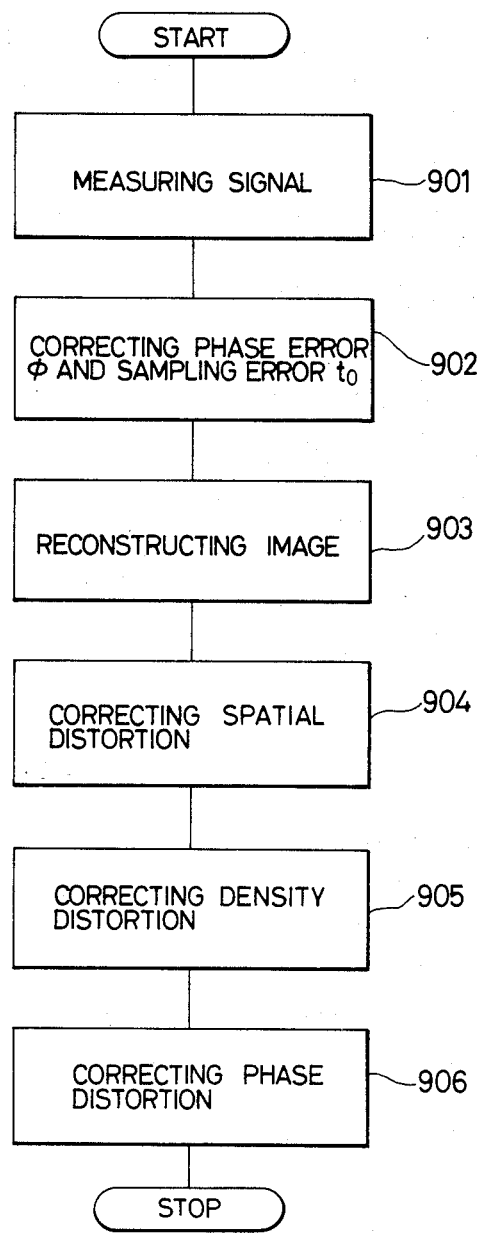

MAGNETIC RESONANCE IMAGING METHOD

BACKGROUND OF THE INVENTION

The present invention relates to a tomograph utilizing the phenomenon of nuclear magnetic resonance (hereinbelow, termed 'NMR'), which is used for medical diagnoses.

The constituents of an NMR imaging apparatus include a static magnetic field, a gradient magnetic field, an rf magnetic field, a detection part, etc. Since the positions of spins are determined by the combination of the static field and the gradient field, the spatial uniformities of these magnetic fields are required.

The inhomogeneity of a static field distribution brings an image phase distortion, spatial distortion and density distortion. On the other hand, the inhomogeneity of a gradient field distribution brings an image spatial distortion and density distortion. Accordingly, it is necessary for enhancing the quality of an NMR image to precisely measure the static and gradient field distributions and to correct the image on the basis of the measured values.

Heretofore, techniques in which only the distribution of the static field is measured have been proposed. There are Kawanaka's method and Sekihara's method (Kawanaka et al., "METHOD OF AUTOMATICALLY CORRECTING IMAGE DISTORTIONS ASCRIBABLE TO NON-UNIFORMITIES OF STATIC FIELD IN NMR IMAGING," Transactions of IECE, '85/3, Vol. J68-D; Sekihara et al., "NEW METHOD OF MEASURING A STATIC FIELD DISTRIBUTION USING NMR IMAGING," JAMIT, Vol. 2S, No. 1). The Kawanaka method is a technique relating to the spatial distortion of an image, while the Sekihara method is the technique with note taken of the phase distortion of an image. The prior-art methods, however, have not been sufficient in precision because the inhomogeneity of the gradient field distribution is neglected though it is also a factor for causing the spatial distribution.

In measuring static fields, methods directly employing instruments are common, but they have problems in the measuring period of time and the precision. Recently, there have been proposed techniques in which the distribution of the static field is measured using an imaging apparatus itself and on the basis of data obtained by imaging a known object.

Typical is a method by Sekihara, "NMR IMAGING FOR MAGNETS WITH LARGE NON-UNIFORMITIES." In this method, a uniform phantom is measured using a sequence shown in FIG. 1, and a static field distribution is calculated from the phase information thereof. The method will now be explained more in detail.

The point of difference between the sequence in FIG. 1 and an ordinary sequence lies in the manner of selecting $\tau_1$ and $\tau_2$ in the figure. In the ordinary sequence, $\tau_1 = \tau_2$ is set for measurement, whereas in FIG. 1, $\tau_1 \neq \tau_2$ is set for the measurement. The origin of an NMR signal 108 to be measured (the position of a peak P in the figure) can be moved at will by controlling the application period of time $\tau_3$ of a gradient field 103. The phase $\theta$ of an image measured according to the sequence of FIG. 1 takes a value which is proportional to the time difference $(\tau_1 - \tau_2)$ between $\tau_1$ and $\tau_2$ and the error $\epsilon$ of the static field distribution. That is, $\theta \# \epsilon (\tau_1 - \tau_2)$ holds. Since the value of $(\tau_1 - \tau_2)$ is known, the static field distribution can be obtained from the phase $\theta$. In this case, in order to eliminate the influences of a phase distortion attributed to a detecting part and a phase distortion attributed to the fact that $(\tau_1 - \tau_2)$ cannot be accurately controlled, measurement is also performed with the sequence of $\tau_1 = \tau_2$, and the phase $\theta$ is conjectured from the resulting difference.

However, the above method, the following disadvantages are involved:

At least two measurement operations are necessary.

For the purpose of eliminating the influences of the phase distortions attributed to the factors other than a static field inhomogeneity, it is necessary to take an image at $\tau_1 = \tau_2$ and to subtract the phase of the image of $\tau_1 = \tau_2$ from the phase of an image at $\tau_1 \neq \tau_2$. That is, at least two measurement operations are required.

In addition, The dynamic range narrows.

As stated above, the two measurement operations are performed to execute the subtraction of the phases, therefore, the dynamic range narrows. Now, letting $\theta_1$ denote the phase angle at $\tau_1 \neq \tau_2$ and $\theta_2$ denote the phase angle at $\tau_1 = \tau_2$, the following conditions need to be satisfied:

$$|\theta_1| \leq \pi$$

$$|\theta_2| \leq \pi$$

$$|\theta_1 - \theta_2| \leq \pi$$

Thus, in order to meet the conditions at all times, the dyanmic range narrows as follows:

$$|\theta_1| \leq \pi/2$$

$$|\theta_2| \leq \pi/2$$

This indicates that the setting of $\tau_2$ for the measurement operations becomes more difficult.

SUMMARY OF THE INVENTION

An object of the present invention is to remove the disadvantages of the prior-art measurement method mentioned above and to provide a method which measures a static field distribution through one measurement operation.

Another object of the present invention is to provide an image distortion correcting method in which the inhomogeneities of a static field distribution and a gradient field distribution are both considered.

The fundamental idea of the present invention for accomplishing the first object is that the changes of a phase ascribable to factors other than the inhomogeneity of a static field are intended to be corrected by utilizing the properties of an NMR signal.

Basically, the changes of the phase are caused by the dynamic characteristics of the gradient field, the characteristics of the detecting part and the spatial distortion of the static field.

Accordingly, when the phase distortions attributed to the dynamic characteristics of the gradient field and the characteristics of the detecting part are removed by any means, the remaining phase change is based on the spatial distortion of the static field, and a static field distribution can be evaluated from the relationship between a phase magnitude and the distortion.

The distortion due to characteristics due to the detecting part gives rise to a uniform phase rotation in the whole image on account of the phase shift between a measurement signal and a detection signal. A correction magnitude therefor is determined based on the fact that the Fourier transform of an NMR signal measured without applying a phase-encoding gradient field in a y-direction becomes the projection data of a measurement slice, so that the integral value thereof may be maximized. This makes use of the properties that the projection data ought to become a plus value and that it comes to have a minus value on account of the phase shift, so the integral value decreases.

The distortion due to the dynamic characteristics of the gradient field appears for the reason that sampling points deviate from the origin of the measurement signal. With note taken of the property of the Fourier transform that the time deviation of complex conjugate signals becomes a rectilinear phase change, a correction magnitude is calculated from the inclination angle of the phase of the data after the Fourier transform of the NMR signal having undergone the phase change due to the dynamic characteristics of the gradient field.

The fundamental idea of the present invention for accomplishing the second object is that the relationships of the distortions of a static field distribution and a gradient field distribution with the distortions of an image are quantitatively found, whereupon the spatial distortion and the phase distortion are combined so as to simultaneously obtain the static field distribution and the gradient field distribution.

Now, the relations between a magnetic field inhomogeneity and a measurement signal will be clarified.

The measurement signal which is obtained in an ideal system under a homogeneous magnetic field can be expressed as follows:

$$S(t, G) = k \int\int M(x,y) \exp[i\gamma(G \cdot y \cdot t_y + G_x \cdot x \cdot t)] dx dy \quad (1)$$

Here,
k: proportion constant of a detecting system,
$\gamma$: gyromagnetic ratio (H: $2\pi \times 4.258$ kHz (Gauss)),
G: gradient of y-direction gradient field,
$t_y$: application period of time of the above G,
$G_x$: gradient of x-direction gradient field, and
t: application period of time of the above $G_x$.

The influence of a transverse relaxation time $T_2$ is omitted assuming that $T_2$ be sufficiently great as compared with the observation period of time.

When the non-uniformity $E_s(x,y)$ of a static field and the errors $E_x(x,y)$ and $E_y(x,y)$ of the gradient fields from the ideal gradients are considered for Eq. (1), the measurement signal can be formularized as follows:

$$S(t, G) = k e^{i\phi} \int\int \widetilde{M}(x,y) \exp[i\gamma(Gy't_y + G_x x't)] dx' dy' \quad (2)$$

Here, $\widetilde{M}(x,y) = M(x,y)\exp[i\{\phi + \gamma(E_s(x,y) - G_x X')t_0\}]/J(x,y)$ $J(x,y) = 1 + \frac{\partial}{\partial x} E_x(x,y) + \frac{1}{G_x} \frac{\partial}{\partial x} E_s(x,y) + \frac{\partial}{\partial y} E_y(x,y)$ $x' = x + E_x(x,y) + \frac{1}{G_x} E_s(x,y)$ $y' = y + E_y(x,y)$ $t_0$ = sampling point error due to the dynamic characteristic of the x-direction gradient field
$\phi$ = phase shift of a detection signal Accordingly, the following relations between the inhomogeneities and the image are obtained:

[Spatial distortion]

$$\begin{cases} x' = x + E_x(x,y) + \frac{1}{G_x} E_s(x,y) \\ y' = y + E_y(x,y) \end{cases} \quad (3)$$

[Density distortion]

$$J = 1 + \frac{\partial}{\partial x} E_x(x,y) + \frac{1}{G_x} \frac{\partial}{\partial x} E_s(x,y) + \frac{\partial}{\partial y} E_y(x,y) \quad (4)$$

[Phase distortion]

$$\exp[i(\phi + \gamma(E_s(x,y) - G_x X')t_0)] \quad (5)$$

Here, $t_0$ denotes the period of time of the deviation between the sampling origin and the signal origin. Although this time length can be changed to some extent by changing the application timing of the gradient field, it cannot be strictly controlled.

$\phi$ indicates the phase shift between the measurement signal and the detection signal in the detecting part, and it is also difficult to control.

Accordingly, unknown variables in the aforementioned expressions of the distortions are:

$E_s(x,y), E_x(x,y), E_y(x,y), \phi, t_0$

Among them, $\phi$ and $t_0$ can be found independently of the inhomogeneities of the magnetic fields [Sano et al.: PHASE DISTORTION CORRECTING TECHNIQUE IN NMR IMAGING, National Convention Record, 1985 IECE]. The measurement signal after the corrections of $\phi$ and $t_0$ is expressed as follows:

$$\widetilde{S}(t',G) = k \int \widetilde{M}(x',y') \exp[i\gamma(G_y y' t_y + G_x x' t')] dx' dy' \quad (6)$$

Here, $\widetilde{M}(x',y') = \frac{M(x,y)}{J(x,y)} \exp[i\gamma E_s(x,y)t_0]$ $t' = t - t_0$ $x' = x + E_x(x,y) + E_s(x,y)/G_x$ $y' = y + E_x(x,y)$ It is understood from Eq. (6) that the inhomogeneities of the static field and the gradient fields inflict the spatial distortion and the phase distortion upon the image.

Accordingly, when the spatial distortion and phase distortion of the image are measured by any method, $E_s(x,y)$, $E_x(x,y)$ and $E_y(x,y)$ can be found.

To the contrary, when $E_s(x,y)$, $E_x(x,y)$ and $E_y(x,y)$ are known, the distortions of the image can be corrected.

As methods of measuring magnetic field inhomogeneities, the following three are considered. A grid-like phantom for measuring the spatial distortion and a uniform phantom for measuring the phase distortion are employed for the measurements (refer to FIGS. 7(a)-7(c)).

(a) Measuring twice with the grid-like phantom
(b) Measuring once with the uniform phantom and once with the grid-like phantom
(c) Measuring once with a uniform phantom provided with a grid The method (a) utilizes the values x' and y' being the spatial distortions, and makes use of the fact that the distortion of y is affected by only $E_y$. At the first measuring operation, $E_y$ is found, and at the second measuring operation, $E_x$ is found by replacing the gradient fields in the x-direction and y-direction. Then, $E_s$ can be obtained through a calculation.

With the method (b), $E_s$ is obtained from the phase distortion by means of the uniform phantom. Subsequently, x' and y' are obtained to find $E_x$ and $E_y$ by means of the grid-like phantom.

With the method (c), the phantom is contrived, whereby the phase distortion and the spatial distortions are simultaneously found, and $E_s$, $E_x$ and $E_y$ are obtained through a procedure similar to that of the method (b). Such a measure is permitted because of the utilization of the property that the magnetic field inhomogeneity is continuous and does not change abruptly.

BRIEF DESCRIPTION OF THE DRAWINGS

FIG. 8 is a flow chart showing the processing steps of a magnetic field inhomogeneity measurement according to the present invention; and FIG. 9 is a flow chart showing the processing steps of image distortion corrections according to the present invention.

DETAILED DESCRIPTION OF THE PREFERRED EMBODIMENTS

Figure 1:
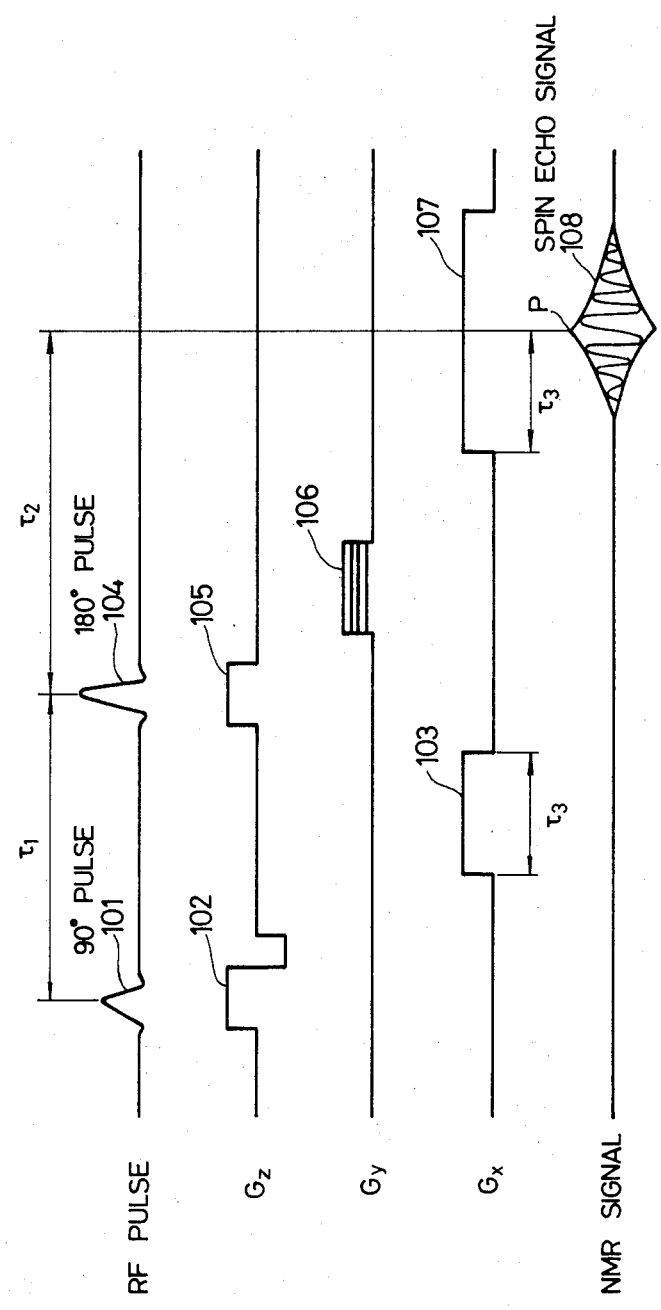
FIG. 1 is a diagram showing an example of the pulse sequence of a prior-art method.
Figure 2:
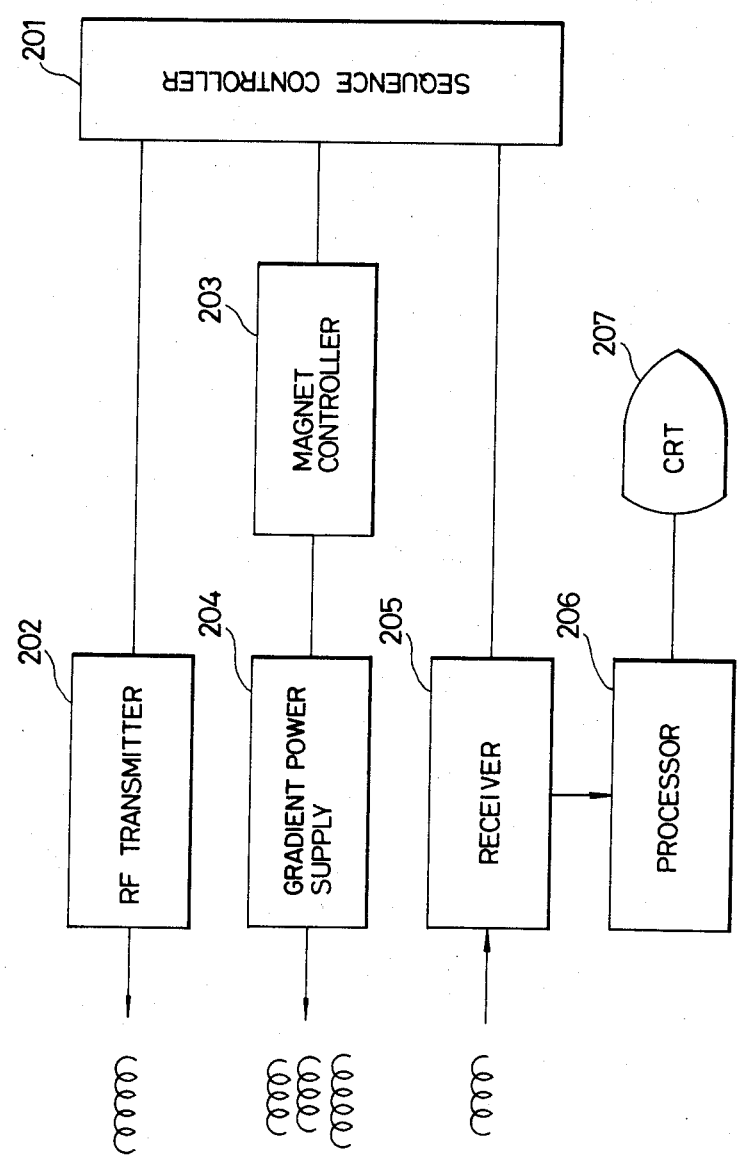
FIG. 2 is a block diagram showing an embodiment of the present invention.

FIG. 2 is a block diagram showing the arrangement of one embodiment of the present invention. A sequence controller 201, which controls various pulses and magnetic fields generated for detecting an NMR signal from an object to-be-examined, is used for controlling a transmitter 202 which generates RF pulses in order to cause the specified nuclide of the object to resonate, a magnet controller 203 which generates a static field for determining the resonance frequency of the NMR signal and a gradient field capable of having its intensity and direction controlled at will, and a receiver 205 which detects the NMR signal produced from the object and thereafter measures it. An image is reconstructed by a processor 206 on the basis of a measurement signal applied from the receiver 205, and the reconstructed image is displayed on a CRT display 207. A gradient power supply 204 generates the magnetic field necessary for the measurement on the basis of a control signal delivered from the magnet controller 203.

Figure 3:
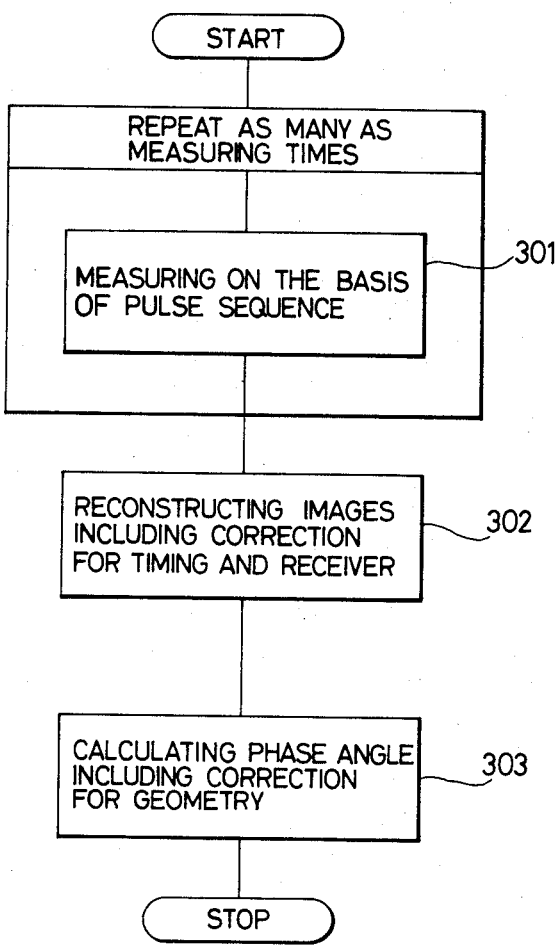
FIG. 3 is a flow chart showing the processing steps of the present invention.

A method of performing the measurement of a static field distribution as based on the present invention of the above construction will now be described with reference to FIGS. 3 and 4. FIG. 3 is a flow chart showing the steps of the whole imaging processing of the static field distribution according to the present invention. Here will be described an example in which a pulse sequence based on the spin echo method is employed and in which an image is reconstructed using the two-dimensional Fourier transform, but the same idea can of course be applied to a case where an image is reconstructed using the projection reconstruction method. In addition, a sequence in FIG. 4 in which $\tau_1 = \tau_2$ holds will be referred to in the description, a static field distribution can be found by quite the same steps also in case of $\tau_1 \neq \tau_2$.

Figure 4:
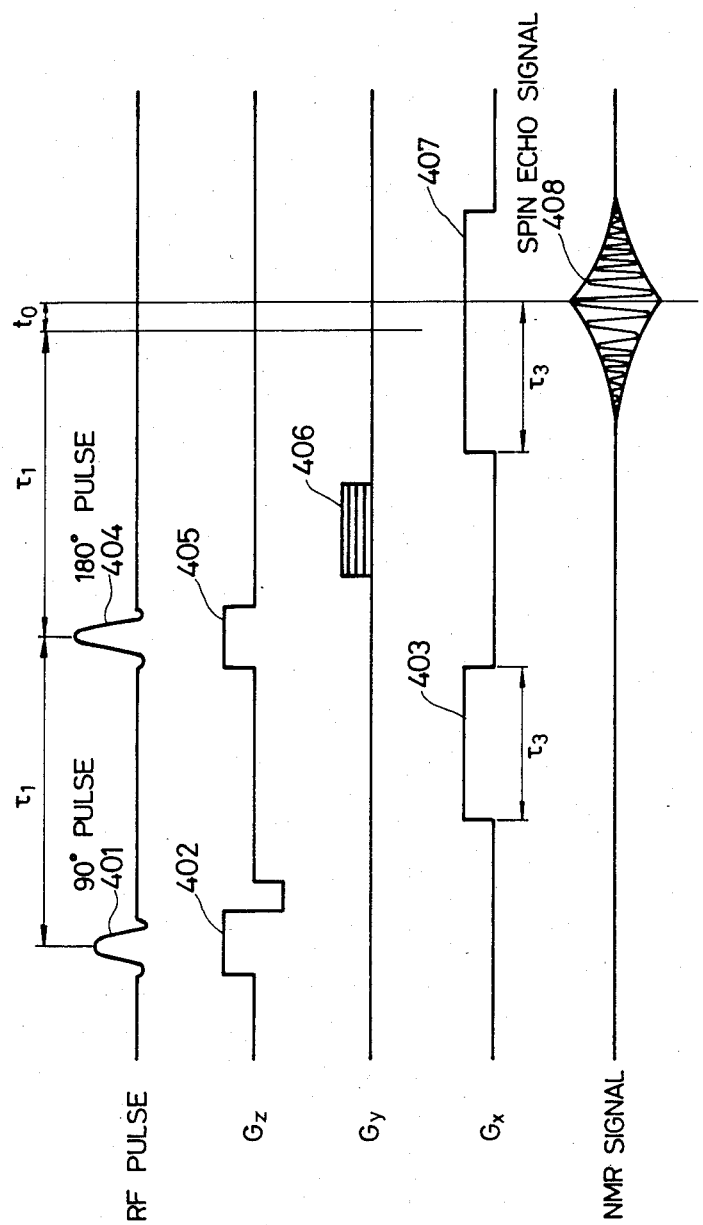
FIG. 4 is a diagram showing an example of a pulse sequence which forms measurement steps for performing the present invention.

Step 301:

A uniform phantom is measured in accordance with the pulse sequence in FIG. 4. NMR signals 408 are measured, for example, 256 times while the gradient of the gradient field in the y-direction is being changed. At this time, the x-direction gradient field 403 is applied longer by a period of time $t_o$ than a half period of time during which gradient field 407 is applied.

Step 302:

The NMR signal 408 obtained after orthogonal detection involves distortions due to various factors. Distortions affecting phase information are sampling point error of the NMR signal attributed to the dynamic characteristic of the gradient field, characteristic of the detecting part or receiver and non-uniformity of the static field a. Accordingly, when the distortions due to sampling point error and the characteristics of the detecting part are corrected and an image is reconstructed at this step, the non-uniformity of the static field is obtained as the phase information. Methods of correcting the distortions due to the sampling point error and the characteristics of the detecting part will be explained later.

Step 303:

The NMR image obtained by the preceding step 302 becomes a complex signal indicated by the following equation:

$$f(x',y') = f_R(x',y') + if_I(x',y')$$

A phase angle can be calculated by the following equation:

$$\theta(x',y') = \mathrm{sgn}(f_x(x',y'))\arccos\left(\frac{f_x(x',y')}{\sqrt{f_R^2(x',y') + f_R^2(x',y')}}\right) \quad (7)$$

This value has the following relation with the non-uniformity $E_s$ (x, y) of the static field:

$$\theta(x',y') = \gamma E_s(x,y) t_o \quad (8)$$

Here, $\gamma$: gyromagnetic ratio (H: $2\pi \times 4258$ $$\begin{cases} \gamma\text{: gyromagnetic ratio}(H{:}2\pi \times 4258 \\ \quad \text{KHz/Gauss}) \\ x' = x + E_s(x,y)/G_x \\ y' = y \end{cases}$$

Accordingly, this equation is reduced to:

$$E_s(x,y) = E_s\left(\frac{x' - \theta(x',y)}{(G_x\gamma t_o), y}\right) = \frac{1}{\gamma t_o}\theta(x',y) \quad (9)$$

and the coordinate system (x',y) of data obtained by the reconstruction is transformed into a desired coordinate system (x,y) to correct the geometric distortions.

That is, $E_s(x,y)$ can be evaluated from the observation of $\theta(x',y)$. Therefore, the static field distribution can be obtained by the sampling process.

Figure 5:
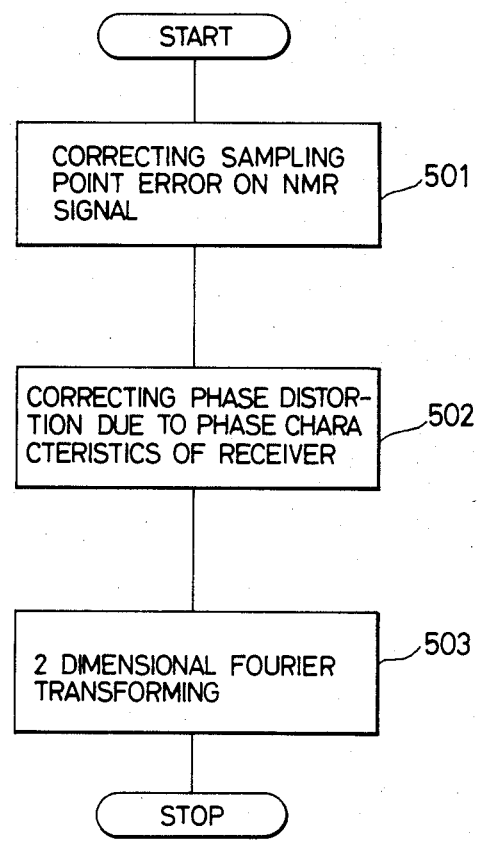
FIG. 5 is a flow chart showing processing steps for correcting phase distortions attributed to the phase shift of a detecting part and the dynamic characteristic of a gradient field.

Next, the processes for correcting sampling point error of the NMR signal attributed to the dynamic characteristics of the gradient field and the characteristics of the detecting part or receiver will be explained. The processing flow therefor is shown in FIG. 5.

Step 501:

The origin of the time axis of the NMR signal 408 observed with the receiver 205 ought to be later than a 90° pulse 401 by a period of time $(2\tau_1 + t_o)$, but it deviates slightly for causes such as the dynamic characteristic of the gradient field. On this occasion, it is right that the origin of the sampling point of the NMR signal 408 $[g(G_y, t)]$ is set to be later by the period of time $(2\tau_1 + t_o)$. Since, however, the origin does not come into agreement anyway, it may well be set later by a period of time $2\tau_1$. After the sampling, the time deviation is corrected. As a method therefor, by utilizing the property that the real part of measurement data without the application of a y-direction gradient field 406 ($G_y$) becomes an even function, while an imaginary part becomes an odd function, the time error is detected and the observation data is corrected. A method for the detection will be described in detail later.

Step 502:

Note is taken of the origin of the NMR data corrected by the above step. When the observation signal and the detection signal are in phase, the origin of the measurement data without the application of the gradient field 406 ($G_y$) is such that the value of the real part is positive, while the value of the imaginary part is zero. In general, however, the phase changes are due to the characteristic of the detecting part, and this condition is not met. Accordingly, a calculative angle is obtained on the basis of the following equation:

$$\theta = sgn(g_I(0,0))arccos(\gamma) \quad (10)$$

Here, $$\gamma = \frac{g_R(0,0)}{|g(0,0)|} \quad 0 \leq \cos^{-1}(\gamma) \leq \pi$$

and $g(0,0) = g_R(0,0) + ig_I(0,0)$, $|g(0,0)| = \sqrt{g_R^2(0,0) + g_I^2(0,0)}$ Using the angle $\theta$ obtained, the whole observation data is subjected to the corrections of the following expressions:

$$\begin{cases} \tilde{g}_R(G_y, t) = g_R(G_y, t)\cos\theta + g_I(G_y, t)\sin\theta \\ \tilde{g}_I(G_y, t) = -g_R(G_y, t)\sin\theta + g_I(G_y, t)\cos\theta \end{cases} \quad (11)$$

$$\tilde{g}(G_y, t) = \tilde{g}_R(G_y, t) + \tilde{g}_I(G_y, t)$$

Step 503:

Using the observation data obtained by the preceding step, a two-dimensional Fourier transform is performed. That is:

$$F[\tilde{g}(G_y, t)] = f(x, Y)$$
$$= f_R(x, y) + if_I(x, y) - 1;$$

The result becomes an NMR image.

Next, the details of the correcting method at the step 501 will be explained. The method includes the following three types:

First, measurement data is subjected to a one-dimensional Fourier transform and then subjected to a phase correction proportional to a frequency, whereupon the transformed data is restored by an inverse Fourier transform, second, measurement data is resampled with a sinc function, and third, in the x-direction of a reconstructed image, phase corrections proportional to positions are made.

Equivalent results are obtained with all the methods, but the third method is the most suitable from the viewpoint of a computing period of time. The phase changes rectilinearly, depending upon the position. Letting $\alpha$ denote the inclination of the rectilinear change, the image is corrected on the basis of the following expressions:

$$\begin{cases} \overline{f_R}(x,y) = f_R(x,y)^*\cos\alpha x + f_I(x,y)^*\sin\alpha x \\ \overline{f_I}(x,y) = -f_R(x,y)^*\sin\alpha x + f_I(x,y)^*\cos\alpha x \end{cases} \quad (13)$$

Here, $$\overline{f}(x,y) = \overline{f_R}(x,y) + \overline{f_I}(x,y)$$

indicates the corrected image.

Figure 6:
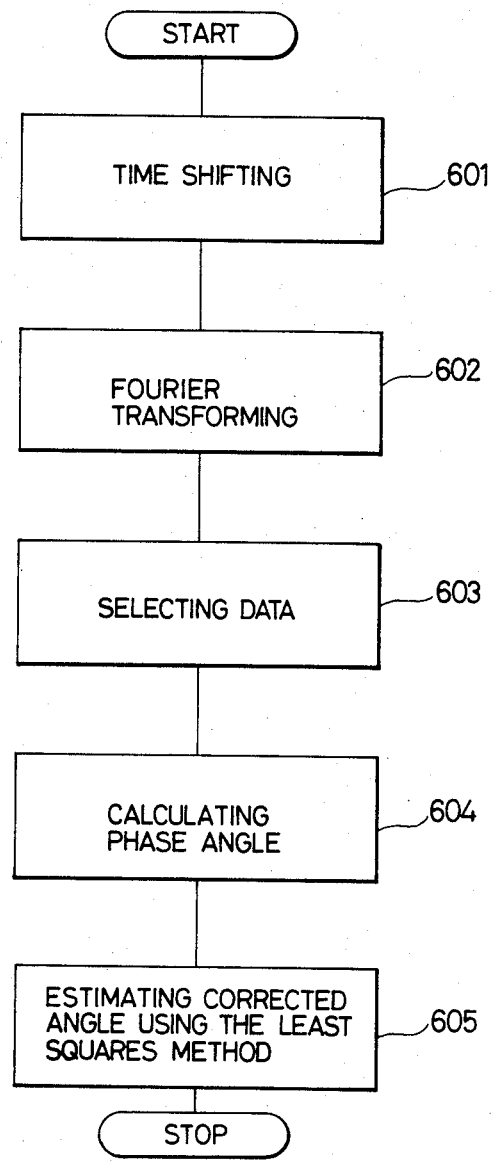
FIG. 6 is a flow chart showing steps for calculating a timing error in the phase distortion correction.

In the above, the entire processing for correcting the distortions have been explained. Now, the detailed procedure for the timing error at the step 501 will be described with reference to FIG. 6. Data to be processed is the measurement data g(O, t) without the application of the gradient field 406 ($G_y$). Hereinafter, for the sake of brevity, it is written g(t). Assuming it to be the true signal, the signal actually observed deviates by a period of time $\alpha_1$. That is, this signal is expressed as $g(t - \alpha_1)$.

Here
$\alpha_1 \neq \alpha$ if $\alpha_1 >$ sampling interval
$\alpha_1 = \alpha$ if $\alpha_1 \leq$ sampling interval Step 601:

The peak value of a sampling point is brought to the position of the origin. The timing error is made within one sampling point by this processing step. Owing to this process, the signal becomes $g(t - \alpha)$ ($\alpha <$ sampling interval).

Step 602:

$g(t - \alpha)$ is Fourier-transformed. That is:

$$F[g(t-\alpha)] = G(x)e^{-i\alpha x} = \overline{G}(x) \quad (14)$$

Here, $$F[g(t)] = G(x)$$

On the basis of the property of g(t), G(x) is a real number value.

Step 603:

The following is found for every sampling point of x in Eq. (14):

$$Ang[G(x)e^{-i\alpha x}] = -\alpha x \quad (15)$$

Here, Ang is a function to calculate a phase component of the detected signal.

Since noise is usually superposed, an observation phase $\beta(x_i)$ becomes:

$$\beta(x_i) = -\alpha x_i + n_i \quad (16)$$

where $n_i$ denotes the noise.

The reliability of the value of $\beta(x_i)$ is considered to be substantially proportional to the magnitude of an amplitude $G(x_i)$. Therefore, only sampling points $x_i$ whose amplitudes $G(x_i)$ have magnitudes not smaller than a certain value are selected.

Step 604:

Regarding $x_i$ selected by the preceding step, the phase angles $\beta(x_i)$ are found on the basis of the following equation:

$$\beta(x_i) = sgn(\tilde{G}_I(x_i)) arccos\left(\frac{\tilde{G}_R(x_i)}{\sqrt{\tilde{G}_R^2(x_i) + \tilde{G}_I^2(x_i)}}\right) \quad (17)$$

Here, $\tilde{G}(x) = \tilde{G}_R(x) + i\tilde{G}_I(x)$

Step 605:

The inclination $\alpha$ is a estimated using the least squares method. That is, is calculated by:

$$\alpha = \frac{\sum_{x \in \Omega} 1 \times \sum_{x_i \in \Omega} \{\beta(x_i) \times x\} - \sum_{x_i \in \Omega} x_i \times \sum_{x_i \in \Omega} \beta(x_i)}{\sum_{x_i \in \Omega} x_i^2 \times \sum_{x_i \in \Omega} 1 - \left(\sum_{x_i \in \Omega} x_i\right)^2}$$

Using $\alpha$ obtained by the above step, the timing error correction at the step 501 is made in accordance with Eqs. (13).

Now, as another embodiment, a method of performing static field and gradient field distribution measurements based on the present invention having the arrangement of FIG. 2 will be described with reference to FIGS. 4 and 8. Although here will be described the method of measuring time with the grid-like phantom among the three sorts of methods of measuring magnetic field inhomogeneities stated in the Summary of the Invention above, the measurements can be similarly realized as to measuring once with the uniform phantom and once with the grid-like phantom, and measuring once with a uniform phantom provided with a grid. FIG. 8 is an example of a flow chart which shows measurement steps according to the present invention.

Figure 7A:
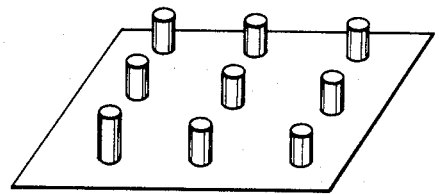
FIGS. 7(a)-7(c) are views for explaining examples of phantoms for use in the present invention.
Figure 7B:
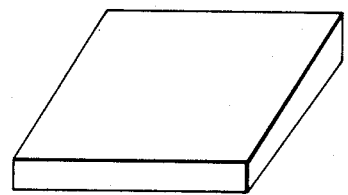
Figure 7C:
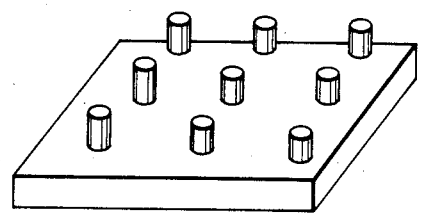

Step 801:

In accordance with the pulse sequence in FIG. 4, the grid-like phantom in FIG. 7(a) is measured to obtain an NMR signal. The measurements are performed 256 times while the intensity of a phase-encoding gradient field 406 is changed. In addition, an x-direction gradient field 403 is applied longer by a period of time $t_o$ than a half period of time during which gradient field 407 is applied.

Step 802:

NMR signal sampling point errors $t_o$ attributed to the dynamic characteristics of the gradient fields, included in the obtained NMR signals 408, and the phase error $\phi$ of the characteristic of the detecting part or receiver are corrected to reconstruct images.

Step 803:

The images obtained by the preceding step involve the following distortions as indicated by Eq. (6):

[Phase distortion]

$$\theta(x',y') = \gamma E_s(x,y)t_o \quad (18)$$

[Spatial distortion]

$$x' = x + E_x(x,y) + E_s(x,y)/G_x \quad (19)$$

$$y' = y + E_y(x,y) \quad (20)$$

Here,
$\gamma$: gyromagnetic ratio,
$E_s$: spatial non-uniformity of the static field,
$E_x$: distortion (per unit gradient) of the x-direction gradient field,
$E_y$: distortion (per unit gradient) of the y-direction gradient field.

Since the present embodiment performs the measurements utilizing the spatial distortions, it uses the relations of Eqs. (19) and (20).

The reconstructed images are images which are spatially distorted in the relations conforming to Eqs. (19) and (20). From the grid-like images, distortion magnitudes at the positions of respective grid elements or bulges are evaluated. A method therefor may be, for example, "METHOD OF AUTOMATICALLY CORRECTING IMAGE DISTORTIONS ASCRIBABLE TO NON-UNIFORMITIES OF STATIC FIELD IN NMR IMAGING" by kawanaka et al., Transactions of IECE, '85/3, Vol. J68-D.

Step 804:

$E_y(x,y)$ is calculated with the distortion magnitude in the y-direction obtained by the preceding step and the relation of Eq. (20).

Step 805:

The grid-like phantom is measured likewise to the step 801. At this time, the sequences of $G_x$ and $G_y$ are replaced with each other. That is, signals are observed by using $G_x$ for phase encoding and applying $G_y$.

Step 806:

Is similar to the step 802.

Step 807:

The spatial distortions of images obtained by the preceding step are expressed by the following equations:

$$x'' = x + E_x(x,y) \quad (21)$$

$$y'' = y + E_y(x,y) + E_s(x,y)/G_y \quad (22)$$

Likewise to the step 803, this step evaluates the distortion magnitudes of the images in the x- and y-directions.

Step 808:

$E_x(x,y)$ is calculated with the distortion magnitudes in the x-direction obtained by the preceding step and the relation of Eq. (21).

Step 809:

The inhomogeneity $E_s(x,y)$ of the static field distribution is evaluated from $E_y(x,y)$ obtained by the step 804 and the distortion in the y-direction obtained by the step 807.

With the above steps, $E_s(x,y)$, $E_x(x,y)$ and $E_y(x,y)$ can be evaluated with the two measuring operations. In addition, since no phase information has been used in the above steps, similar steps are applicable even when the absolute values of the images are obtained instead of making the corrections at the step 802. However, in the foregoing case where the distribution is measured by utilizing the phase information (Eq. (18) is utilized), the steps described here need to be conformed to.

Subsequently, a method of performance for correcting image distortions as based on the measured spatial distortions of the magnetic fields will be described with reference to FIG. 9.

Step 901:
Using the apparatus in FIG. 2, an object to-be-examined is scanned to measure a signal.

Step 902:
Among distortions included in the measured signal, the phase error $\phi$ of the detecting part and the sampling error $t_o$ due to the influence of the dynamic characteristic of the gradient field independent of the spatial distortion of the magnetic field are corrected.

Step 903:
Measurement data is subjected to a two-dimensional Fourier transform, to reconstruct an image. This image denoted by $\tilde{M}(x',y')$ is related to the true image $M(x,y)$ as follows:

$$\begin{cases} \tilde{M}(x',y') = \frac{M(x,y)}{J(x,y)} \exp[i\gamma E_s(x,y)t_o] & (23) \\ J(x,y) = 1 + \frac{\partial}{\partial x} E_x(x,y) + \frac{1}{G_x} \frac{\partial}{\partial x} E_s(x,y) + \frac{\partial}{\partial y} E_y(x,y) & (24) \\ x' = x + E_x(x,y) + E_s(x,y)/G_x & (25) \\ y' = y + E_y(x,y) & (26) \end{cases}$$

Step 904:
The spatial distortion is corrected. Eqs. (25) and (26) are utilized. The relation between (x,y) and (x',y') is found from the distortion $E_s(x,y)$, the distortion $E_x(x,y)$ of the x-direction gradient field and the distortion $E_y(x,y)$ of the y-direction gradient field measured in advance, and $\tilde{M}(x,y)$ is obtained by a resampling process. At this time, the following relation holds:

$$\tilde{M}(x,y) = \frac{M(x,y)}{J(x,y)} \exp[i\gamma E_s(x,y)t_o] \quad (27)$$

Step 905:
The density distortion is corrected. The values of $J(x,y)$ at respective points are found according to Eq. (24), and $\tilde{M}(x,y)$ is multiplied by them. As an alternative to the calculative evaluation of the density distortion, a phantom having a uniform density may be measured so as to obtain the distortion value from the resulting density non-uniformity.

Step 906:
The phase distortion is corrected. As indicated in Eq. (27), the phase distortion magnitudes of respective points are proportional to the distortion magnitudes of the static field at the respective points. Accordingly, the phase distortion corrections are made from $E_s(x,y)$ and on the basis of Eq. (27). As another method for the corrections, if it is apparent that $M(x,y)$ is a plus value, the absolute value of $\tilde{M}(x,y)$ may well be taken.

According to the present invention, it is possible with one measuring operation to measure a static field distribution and to measure a greater static field distortion than with the prior art, so that fast and simple measurement means can be provided. Moreover, as compared with a case of performing two measurement operations and then a subtraction, the invention makes analytical corrections with the single measurement operation, so that the dynamic range can be expanded, and the setting of a parameter, $t_o$ at the measurement is facilitated.

Further, since a static field distribution and x-direction and y-direction gradient field distributions can be obtained with one or two measuring operations, the inhomogeneities of the magnetic field distributions required for image reconstruction of high precision are found in a short time, so that the geometrical distortion, density distortion and phase distortion of an image attributed to the spatial distortions of the static field and the gradient fields can be corrected, and NMR imaging of high precision can be achieved.

What is claimed is:

1. An NMR imaging method using magnetic field generation means to generate a static field, a gradient field and an RF field, detections means to detect NMR signals from an object to-be-imaged, and calculation means to subject the detected signals to a calculation for reconstructing an image, said method including the steps of:
    sampling spin echo signals produced under a condition that a first time interval between a 90° RF pulse and a 180° RF pulse generated by said magnetic field generation means differs from a second time interval between said 180° RF pulse and generation of a spin echo signal;
    processing said sampled spin echo signals for correcting phase errors attributed to said detection means and phase errors attributed to the difference between said first and second time intervals; and
    evaluating a static field distribution based on a relationship between phase magnitudes and distortions of said spin echo signals.

2. An NMR imaging method according to claim 1, wherein in said sampling step, an origin of a sampling axis is set so that said first time interval between said 90° RF pulse and said 180° RF pulse is equal to a time interval between said 180° RF pulse and the origin of the sampling axis.

3. An NMR imaging method according to claim 1, wherein in said sampling, an origin of a sampling step axis is brought into agreement with the time origin of the spin echo signal.

4. An NMR imaging method using means to generate a static field, a gradient field and an RF field, detection means to derive an NMR signal from an object to-be-examined and means to subject the detected signal to various calculations for reconstruction of an image, said method including the steps of:
    executing image reconstruction with a spin echo signal produced under a condition that a time interval between a 90° RF pulse and a 180° RF pulse differs from an interval between the 180° RF pulse and a time origin of the spin echo signal; and
    measuring a static field distribution and a gradient field distribution from spatial distortion magnitudes and phase distortion magnitudes of the reconstructed images.

5. An NMR imaging method according to claim 4, wherein the static field distribution and the gradient field distribution are measured from only the spatial distortion magnitudes.

6. An NMR imaging method according to claim 4, wherein the spatial distortion magnitudes, the phase distortion magnitudes and density distortions of reconstructed images are corrected on the basis of said measured static field distribution and gradient field distribution.

* * * * *